(12) United States Patent
Lee et al.

(10) Patent No.: US 7,088,047 B2
(45) Date of Patent: Aug. 8, 2006

(54) INDUCTIVELY COUPLED PLASMA GENERATOR HAVING LOW ASPECT RATIO

(75) Inventors: Yong-Kwan Lee, Daejeon (KR); Won-Bong Jung, Seoul (KR); Sang-Won Lee, Daejeon (KR); Sae-Hoon Uhm, Seoul (KR); Dong-Seok Lee, Pusan (KR)

(73) Assignee: Plasmart Co. Ltd. (KR)

( * ) Notice: Subject to any disclaimer, the term of this patent is extended or adjusted under 35 U.S.C. 154(b) by 0 days.

(21) Appl. No.: 11/043,207

(22) Filed: Jan. 26, 2005

(65) Prior Publication Data

US 2005/0156530 A1    Jul. 21, 2005

Related U.S. Application Data

(63) Continuation of application No. PCT/KR02/01409, filed on Jul. 26, 2002.

(51) Int. Cl.
  *H01J 7/24*   (2006.01)
  *B44C 1/22*   (2006.01)
  *C23C 16/00*  (2006.01)

(52) U.S. Cl. ............ 315/111.51; 216/69; 118/723 AN

(58) Field of Classification Search ........... 315/111.01, 315/111.11, 111.21, 111.51; 216/63, 67, 216/69; 118/723 R, 723 MW, 723 AN, 728–729; 427/533, 575
See application file for complete search history.

(56) References Cited

U.S. PATENT DOCUMENTS

| | | | | |
|---|---|---|---|---|
| 5,421,891 A * | 6/1995 | Campbell et al. | ........ | 118/723 R |
| 5,429,070 A * | 7/1995 | Campbell et al. | ........ | 118/723 R |
| 6,074,512 A * | 6/2000 | Collins et al. | ......... | 156/345.29 |
| 6,083,344 A * | 7/2000 | Hanawa et al. | ........ | 156/345.28 |
| 6,417,626 B1 * | 7/2002 | Brcka et al. | ............ | 315/111.51 |
| 6,494,998 B1 * | 12/2002 | Brcka | ..................... | 204/192.12 |
| 6,652,711 B1 * | 11/2003 | Brcka et al. | ........... | 156/345.48 |
| 6,926,800 B1 * | 8/2005 | Tachino et al. | ........ | 156/345.48 |
| 2002/0092618 A1 * | 7/2002 | Collins | .................. | 156/345.48 |

FOREIGN PATENT DOCUMENTS

| | | |
|---|---|---|
| EP | 1 079 671 A2 | 2/2001 |
| JP | 2000-048998 A | 2/2000 |

(Continued)

*Primary Examiner*—Thuy Vinh Tran
(74) *Attorney, Agent, or Firm*—St. Onge Steward Johnston & Reens LLC

(57) ABSTRACT

An inductively coupled plasma generator having a lower aspect ratio reaction gas, comprising a chamber having a gas inlet through which a reaction gas is supplied, a vacuum pump for maintaining the inside of the chamber vacuum and a gas outlet for exhausting the reaction gas after completion of the reaction, a chuck for mounting a target material to be processed inside the chamber, and an antenna to which high-frequency power is applied, the antenna provided at the upper and lateral portions of the chamber, wherein the antenna has parallel antenna elements in which a discharge of a high frequency can be allowed and impedance is low to ensure a low electron temperature, the antenna is disposed such that a powered end of each of the antenna elements and a ground end of each of the antenna elements opposite to the powered end are symmetrical in view of the center of an imaginary circle formed by the antenna to establish rotation symmetry of plasma density profiles, the antenna elements are twisted in a helical manner, and the powered end of each of the antenna elements is positioned to be far from the chamber and the ground end of each of the antenna elements is positioned to be close to the chamber, thereby compensating for a drop in the plasma density due to ion loss occurring at the powered end.

4 Claims, 7 Drawing Sheets

FOREIGN PATENT DOCUMENTS

| | | |
|---|---|---|
| JP | 2000-277496 A | 10/2000 |
| JP | 2000-323298 A | 11/2000 |

* cited by examiner

INDUCTIVELY COUPLED PLASMA GENERATOR HAVING LOW ASPECT RATIO

This application is a continuation of pending International Patent Application No. PCT/KR2002/001409 filed Jul. 26, 2002, which designates the United States.

FIELD OF THE INVENTION

The present invention relates to an inductively coupled plasma generator having a lower aspect ratio, and more particularly, to an inductively coupled plasma generator having a lower aspect ratio, which can reduce an electron temperature to be suitable for etching an oxide film, ensure high selectivity by reducing a volume of a chamber, and can accurately fabricate a large-diameter semiconductor wafer by establishing rotation symmetry of a plasma density profile and uniformly maintaining plasma densities at the peripheral and central portions of the chamber.

BACKGROUND ART

In fields of forming fine patterns such as semiconductor wafers or flat panel display devices, plasma is generated and various surface treatments including dry etching, chemical vapor deposition, sputtering and the like, are performed. In recent years, to achieve a reduction in cost and improvement in throughput, wafers for semiconductor devices or substrates for flat panel display devices, tends to be larger, for example, 300 mm or greater. Accordingly, the size of a plasma generator for fabricating a large-sized wafer or substrate gradually increases. Plasma generators are classified into inductively coupled plasma generators, capacitively coupled plasma generators and the like. Also, modified plasma generators in which a magnetic field is applied to a basic plasma generator, have been known.

An inductively coupled plasma generator has a higher plasma density than a capacitive coupled plasma generator. However, the inductively coupled plasma generator requires various additional elements for improvement of uniformity. For example, a dielectric material having a thicker central portion than other portions or a dome-shaped antenna may be employed. However, this approach is complicated to carry out and is difficult to be applied to oxide etching. In other words, since oxide etching requires high selectivity in view of processing conditions, a conventional inductively coupled plasma generator in which uniformity of plasma is controlled by a diffusion method, uses a relatively bulky chamber, resulting in an increase in the residence time of gas in the chamber. Also, the conventional inductively coupled plasma generator provides a high electron temperature (Te) of plasma. As described above, there are several disadvantages in using the conventional inductively coupled plasma generator.

The inductively coupled plasma generator will now be described in detail. The inductively coupled plasma generator includes a chamber in which plasma is generated. The chamber includes a gas inlet through which a reaction gas is supplied, a vacuum pump for maintaining the inside of the chamber to be vacuum and exhausting the reaction gas after completing the reaction, and a gas outlet. Inside the chamber is provided a chuck for mounting a sample such as a wafer or a glass substrate. An antenna connected with a high-frequency power source (generally 13.56 MHz), is installed above the chamber. An insulation plate is installed between the antenna and the chamber to reduce capacitive coupling between the antenna and plasma, thereby promoting energy from the high-frequency power source to be transferred to plasma by inductive coupling.

In the inductively coupled plasma generator having the above-described configuration, a chamber is evacuated by a vacuum pump at an initial stage to make the chamber vacuum, and a reaction gas for generating plasma is then introduced into the chamber through a gas inlet so that the chamber is maintained at a predetermined pressure level. Then, high-frequency power is applied to the antenna from the high-frequency power source.

The conventional inductively coupled plasma generator has employed a single spiral antenna or a plurality of separate electrode type antennas. As RF power is applied, a magnetic field varying over time is formed in a direction perpendicular to a plane formed by the antenna. Such a magnetic field varying over time forms an inductive electric field inside the chamber, and the inductive electric field heats electrons, thereby generating plasma inductively coupled to the antenna. The heated electrons collide with neural gas particles present around the electrons and generate ions and radicals to be used in plasma etching and deposition. Also, if power is applied to a chuck from a separate high-frequency power source, it is possible to control the energy of ions incident to a sample.

However, in the spiral antenna, since the respective inductive coils constituting the antenna are connected to one another in series, a constant current amount flows through each inductive coil. In this case, it is difficult to adjust distribution of inductive electric field, causing loss in ions and electrons on the inner wall of the chamber. Thus, plasma density is unavoidably increased at the center of the chamber and reduced in the neighborhood of the inner wall of the chamber. Thus, it is quite difficult to maintain plasma density at a uniform level.

Also, since the respective inductive coils of the antenna are connected to one another in series, a voltage drop due to the antenna is increased and the antenna is greatly affected by capacitive coupling with plasma. Thus, power efficiency is lowered and it is difficult to maintain uniformity of plasma density.

Next, in the antenna constructed of three separate electrodes, plasma density is high at a location close to the respective separate electrodes connected to three different high-frequency power sources, and plasma density is low at the center of the chamber, making it difficult to maintain uniformity of plasma. In particular, it is quite difficult to process samples over a wide area. Also, since independently operating power sources are used, the cost increases. Further, for impedance matching for efficiently using power, independent impedance matching circuits must be used for the respective electrodes.

In a parallel antenna configured such that multiple circular antennas are concentrically connected to one another in parallel, uniformity of plasma in a rotating direction is lowered, that is, the plasma density is relatively high at the central portion of the antenna and is relatively low at a powered end and a ground end of the antenna. In such a manner, plasma density becomes asymmetrical with respect to the rotating direction because a relatively high voltage is applied to the powered end of the antenna, causing ion loss, resulting in a drop in plasma density. Also, since there is no current flow at a disconnected portion of a loop-type antenna, that is, between the powered end and the ground end, an inductive electric field is not generated, so that less plasma is generated thereat, resulting in a reduction in plasma density. Accordingly, uniform processing of a target material to be processed is difficult to achieve.

DISCLOSURE OF THE INVENTION

To overcome several problems of the prior art, it is an object of the present invention to provide an inductively coupled plasma generator having a lower aspect ratio, which can reduce an electron temperature to be suitable for etching an oxide film, ensure high selectivity by reducing a volume of a chamber, and can accurately fabricate a large-diameter semiconductor wafer by establishing rotation symmetry of a plasma density profile and uniformly maintaining plasma densities at the peripheral and central portions of the chamber.

To achieve the object of the present invention, there is provided an inductively coupled plasma generator comprising a chamber having a gas inlet through which a reaction gas is supplied, a vacuum pump for maintaining the inside of the chamber vacuum and a gas outlet for exhausting the reaction gas after completion of the reaction, a chuck for mounting a target material to be processed inside the chamber, and an antenna to which high-frequency power is applied, the antenna provided at the upper and lateral portions of the chamber, wherein the antenna has parallel antenna elements in which a discharge of a high frequency in the range of 50 MHz~100 MHz can be allowed and impedance is low to ensure a low electron temperature, the antenna is disposed such that a powered end of each of the antenna elements and a ground end of each of the antenna elements opposite to the powered end are symmetrical in view of the center of an imaginary circle formed by the antenna to establish rotation symmetry of plasma density profiles, the antenna elements are twisted in a helical manner, and the powered end of each of the antenna elements is positioned to be far from the chamber and the ground end of each of the antenna elements is positioned to be close to the chamber, thereby compensating for a drop in the plasma density due to ion loss occurring at the powered end.

In the present invention, the respective antenna elements constituting the parallel antenna are twisted in a helical manner to be positioned on the same radius, the powered end of each antenna element is positioned to be far from the chamber, that is, at a relatively upper or outer portion of the chamber, and the ground end of each antenna element is positioned to be close to the chamber, that is, at a relatively lower or inner portion of the chamber, so that a high voltage is applied to the powered end, thereby minimizing a reduction in plasma density due to ion loss of the powered end. Also, a plasma density reduction due to ion loss occurring at the powered end, and a plasma density reduction due to a non-inductive electric field at the disconnected portion of the powered end and the ground end of an antenna, can be compensated for because the central portions of the other antenna elements having the same radium and twisted with each other in a double-helical manner, that is, a portion at which plasma density is relatively higher than at the powered end P, overlap at the same location, thereby ensuring rotation symmetry of a plasma density profile.

Also, in the present invention, in order to generate plasma in a uniform density throughout the chamber, an outer parallel antenna and an inner parallel antenna may be further provided above the chamber.

Further, the parallel antenna according to the present invention may be configured such that two antenna elements symmetrically cross each other at an angle of 180° and are twisted in a double-helical manner. Also, the parallel antenna according to the present invention may be configured such that three antenna elements symmetrically cross each other at an angle of 120° and are twisted with one another in a triple-helical manner. Also, the parallel antenna according to the present invention may be configured such that four antenna elements are twisted with one another at an angle of 90° and are twisted with one another in a quadruple-helical manner. In order to attain a lower aspect ratio, more than four antenna elements may be parallel-connected with and cross one another in view of the center and twisted with one another in a multiple-helical manner.

In the present invention, in order to maintain plasma density profiles at the peripheral and central portions of the chamber at a uniform level, the outer parallel antenna and the inner parallel antenna are provided. Also, means for adjusting current amounts applied to the outer parallel antenna and the inner parallel antenna. Further, for adjusting antenna impedance, the number of crossings of the inner parallel antenna is made different from the number of crossings of the outer parallel antenna.

BEST MODE FOR CARRYING OUT THE INVENTION

Non-limiting embodiments of the present invention will now be described in detail with reference to the accompanying drawings.

Figure 1:
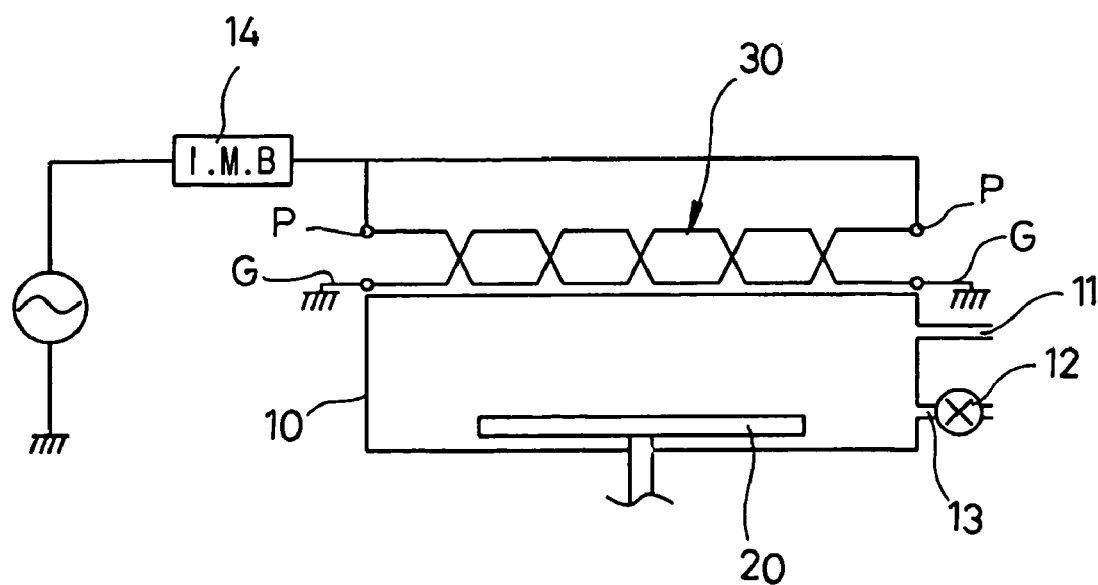
FIG. 1 is a cross-sectional view of a plasma generator according to an embodiment of the present invention.

FIG. 1 is a cross-sectional view of a plasma generator according to an embodiment of the present invention, FIG.

Figure 3:
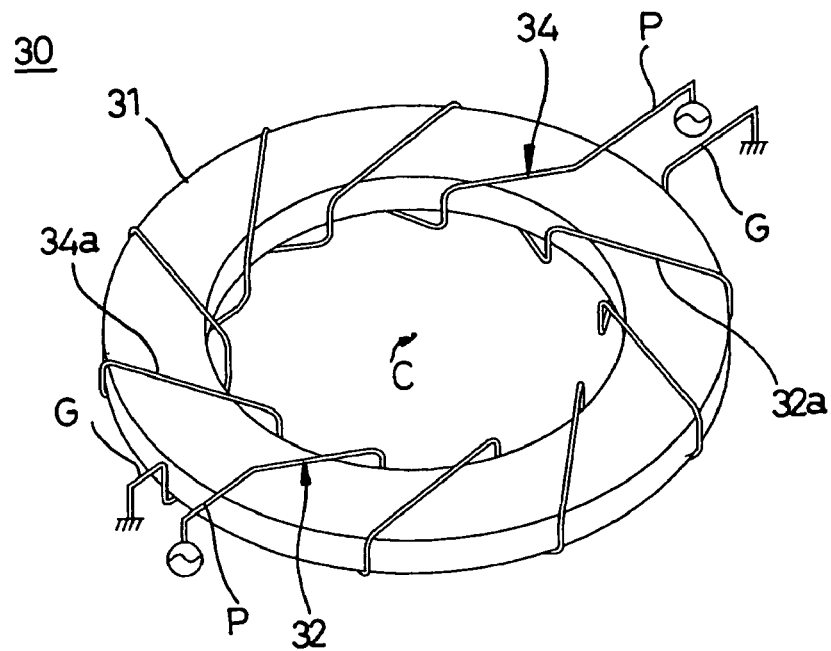
FIG. 3 illustrates the structure of an antenna of the plasma generator according to an embodiment of the present invention.
Figure 4:
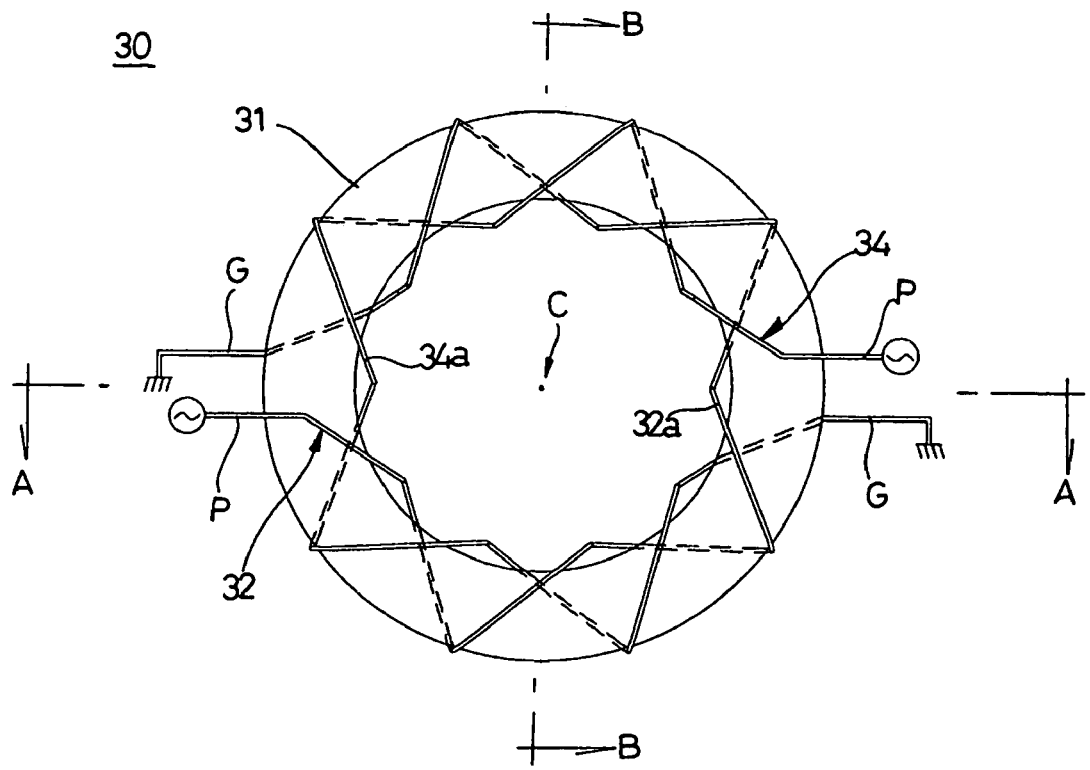
FIG. 4 is a plan view of the antenna of the plasma generator according to an embodiment of the present invention.

2 is an equivalent circuit diagram of the plasma generator according to an embodiment of the present invention, FIG. 3 illustrates the structure of an antenna of the plasma generator according to an embodiment of the present invention, and FIG. 4 is a plan view of the antenna of the plasma generator according to an embodiment of the present invention.

As shown in FIG. 1, the plasma generator according to the present invention is basically constructed of an inductively coupled plasma generator. That is, the plasma generator according to the present invention includes a chamber 10 having a gas inlet 11 through which a reaction gas is supplied, a vacuum pump 12 for maintaining the inside of the chamber vacuum, and a gas outlet 13 through which a reaction gas is exhausted after completion of the reaction, a chuck 20 on which a target material to be processed is placed, the chuck 20 provided inside the chamber 10, and an antenna 30 to which RF power is applied, the antenna 30 provided at the upper portion of the chamber 10.

The antenna 30 is configured such that two antenna elements 32 and 34 are coiled around a planar annular bovine 31 having a predetermined thickness in a twisted manner.

Undefined reference numeral 14 denotes an impedance matching box.

In the present invention, the antenna 30 installed over the chamber 10 is shaped of a parallel antenna. As shown in FIGS. 3 and 4, two antenna elements 32 and 34 are disposed such that a powered end P of each of the antenna elements 32 and 34 is symmetric to a ground end G of each of the antenna elements 32 and 34 in view of the center C of an imaginary circle, the respective antenna elements 32 and 34 are twisted with respect to each other in a double-helical manner, and the powered end P of each of the antenna elements 32 and 34 is far from the chamber (10 shown in FIG. 1) and the ground end G of each of the antenna elements 32 and 34 is close to the chamber 10.

In this embodiment, the respective antenna elements 32 and 34 constituting the antenna 30 are twisted with respect to each other in a double-helical manner and positioned on the same radius. The powered end P of each of the antenna elements 32 and 34 is far from the chamber (10 shown in FIG. 1), that is, positioned at a relatively higher location in view of the chamber 10, and the ground end G of each of the antenna elements 32 and 34 is close to the chamber 10, that is, positioned at a relatively lower location in view of the chamber 10. Thus, a relatively high voltage is applied to the power end P, thereby minimizing a reduction in the plasma density due to ion loss occurring at the powered end P. A drop in the plasma density due to ion loss occurring at the powered end P of one antenna element 32, 34, and a drop in the plasma density due to a non-inductive electric field at a disconnected portion of the powered end P and the ground end G of the one antenna element 32, 34, are compensated for because the central portion 34a, 32a of the other antenna element 34, 32, that is, a portion at which plasma density is relatively higher than at the powered end P, overlaps with the central portion 32a, 34a of the one antenna element 32, 34, thereby ensuring rotation symmetry of a plasma density profile.

Figure 5:
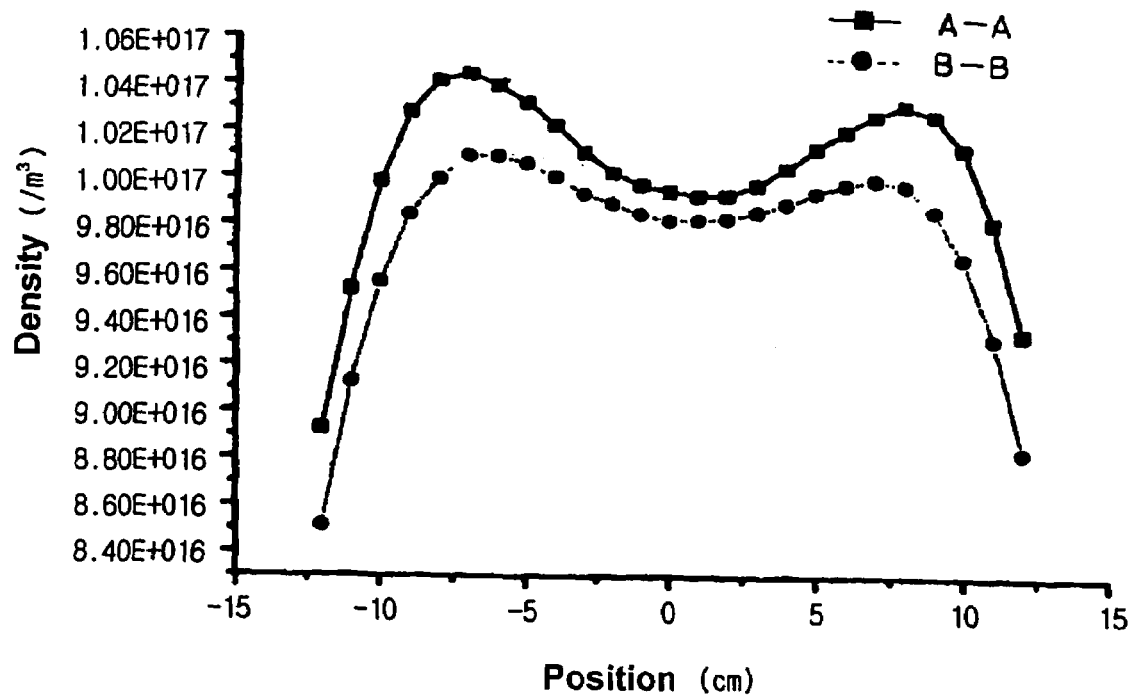
FIG. 5 is a graph illustrating the density profile of plasma generated by the antenna of the plasma generator shown in FIG. 4, taken along lines A—A and B—B.

FIG. 5 is a graph illustrating the density profile of plasma generated by the antenna of the plasma generator shown in FIG. 4, taken along lines A—A and B—B, in which the solid line indicates the distribution of plasma density along the line A—A traversing the powered end P of the antenna elements 32 and 34, and the dotted line indicates the distribution of plasma density along the line B—B perpendicularly traversing the A—A. As shown in FIG. 5, in the plasma generator according to this embodiment, the plasma density profiles are symmetrical with respect to the rotation center of the chamber 10. The antenna elements 32 and 34 symmetrically cross with each other so that asymmetry of the plasma density profile of one antenna element is compensated for by asymmetry of the plasma density profile of the other antenna element, thereby obtaining symmetry of the overall plasma density profile. Also, the plasma density profile in a direction traversing the powered ends of the antenna elements 32 and 34 is similar to that in the perpendicular direction thereof, suggesting that rotation symmetry of the overall plasma density profile can be obtained throughout the chamber 10.

In the plasma generator according to the present invention, as shown in FIG. 5, a chuck for mounting a target material, e.g., a semiconductor wafer, is disposed inside a chamber, which is different from the conventional inductively coupled plasma generator in which a chuck needs to be disposed at a location of a chamber where plasma is dispersed downward and evenly distributed, resulting in an increase in the height of the chamber so that the chamber may become bulky, and a retention time of plasma in the chamber is prolonged. However, in the conventional inductively coupled plasma generator, which is not based on the dispersion of plasma, since plasma is uniformly distributed even at a relatively high location of the chamber, the height of the chamber can be reduced. Accordingly, the volume of the chamber can be minimized, and a retention time of plasma can be shortened, thereby attaining high selectivity required for etching an oxide film. Also, unlike in the conventional inductively coupled plasma generator requiring RF power of generally 13.56 MHz, in the inductively coupled plasma generator according to the present invention, a discharge can be performed with RF power ranging in a relatively high frequency ranging in the range of 50 MHz to 100 MHz, thereby reducing an electron temperature, which is also required for obtaining high selectivity.

Figure 6:
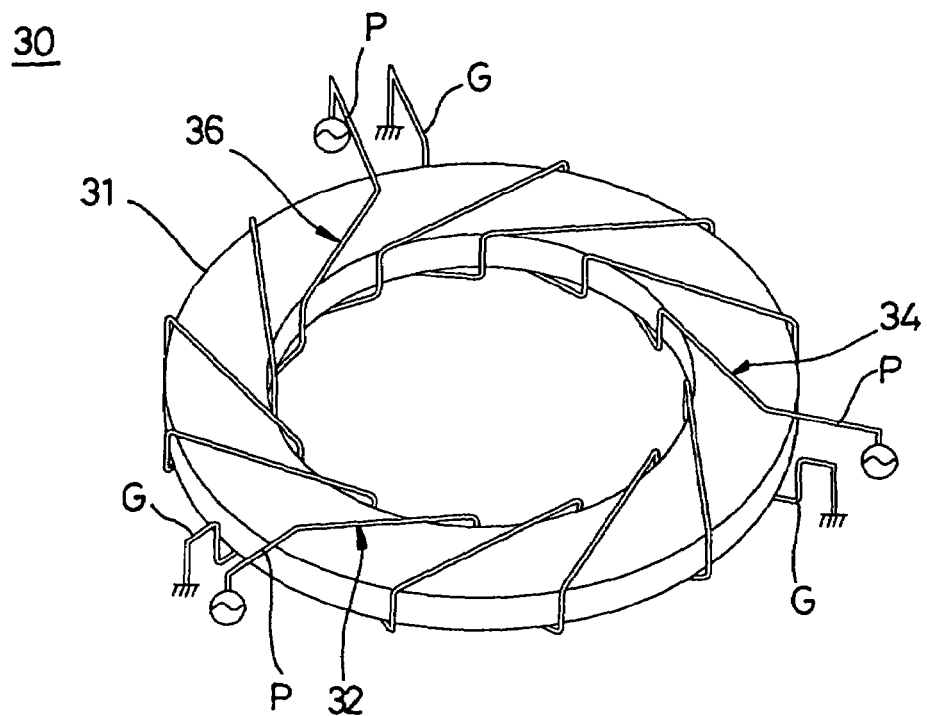
FIG. 6 illustrates the structure of an antenna of the plasma generator according to another embodiment of the present invention.
Figure 7:
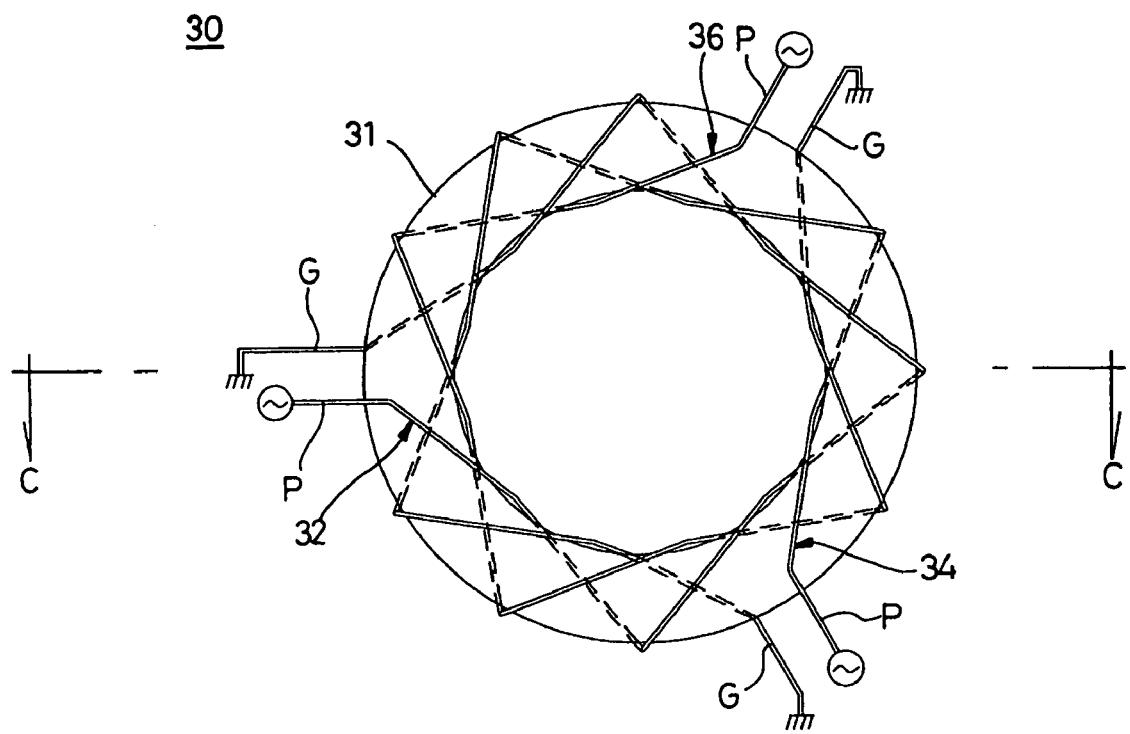
FIG. 7 is a plan view of the antenna shown in FIG. 6.

FIG. 6 illustrates the structure of an antenna of the plasma generator according to another embodiment of the present invention, and FIG. 7 is a plan view of the antenna shown in FIG. 6.

A parallel antenna 30 shown in FIGS. 6 and 7 is constructed by three antenna elements 32, 34 and 36. A powered end P of each of the antenna elements 32, 34 and 36 and a ground end G opposite to the powered end P are symmetrically disposed at an angle of 120° in view of the center C of an imaginary circle. The respective antenna elements 32, 34 and 36 are twisted with one another in a triple-helical manner. The powered ends P of the antenna elements 32, 34 and 36 are disposed at a relatively high location and the ground ends G of the antenna elements 32, 34 and 36 are disposed at relatively low location.

According to this embodiment, the respective antenna elements 32, 34 and 36 constituting the antenna 30 are positioned on the same radius in a triple-helical manner. The powered end P of each of the antenna elements 32, 34 and 36 is far from the chamber 10, that is, positioned at a relatively higher location in view of the chamber 10, and the ground end G of each of the antenna elements 32 and 34 is close to the chamber 10, that is, positioned at a relatively lower location in view of the chamber 10. Thus, a relatively high voltage is applied to the power end P, thereby minimizing a reduction in the plasma density due to ion loss occurring at the power end P. A drop in the plasma density due to ion loss at the powered end P of one antenna element 32, and a drop in the plasma density due to a non-inductive electric field at a disconnected portion of the powered end P and the ground end G of the one antenna element 32, are compensated for because the central portions 34*a* and 36*a* of the other antenna elements 34 and 36 having the same radium and twisted with each other in a double-helical manner, that is, a portion at which plasma density is relatively higher than at the powered end P, overlap at the same location, thereby ensuring rotation symmetry of a plasma density profile.

The structure of the antenna according to the present invention is not limited to the above-described double- and triple-helical structures, and the antenna may be constructed in any structure that can realize a lower aspect ratio, for example, a quadruple-helical antenna in which four antenna elements are twisted with one another at an angle of 90°, or a multiple-helical antenna in which more than four antenna elements are parallel-connected and twisted with one another in a multiple-helical manner.

Figure 8:
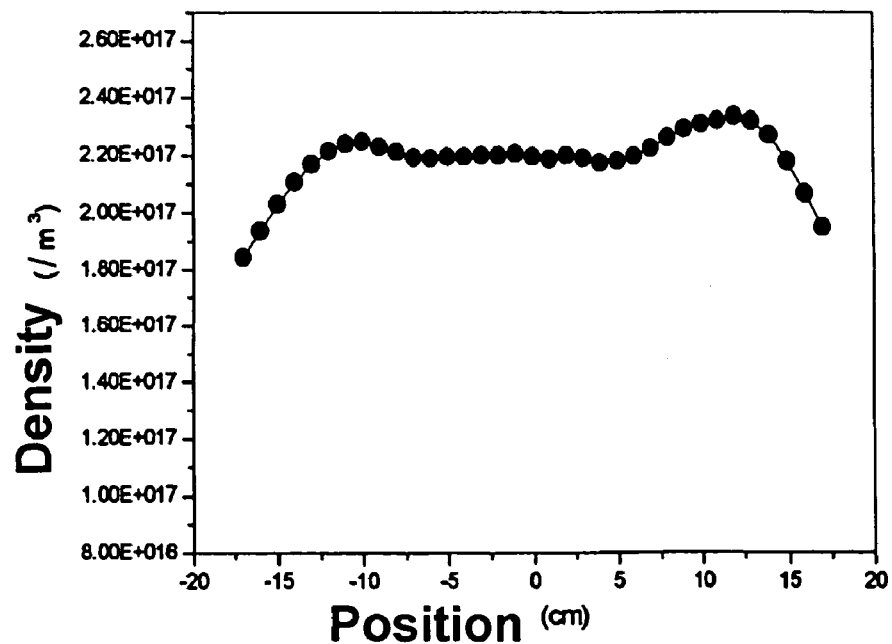
FIG. 8 is a graph illustrating the density profile of plasma generated by the antenna of the plasma generator shown in FIG. 7, taken along line C—C.

FIG. 8 is a graph illustrating the density profile of plasma generated by the triple-helical antenna of the plasma generator shown in FIG. 7, taken along line C—C. As shown in FIG. 8, the plasma density profiles in directions traversing the central portion of the antenna from the powered and ground ends of one of the antenna elements 32, 34 and 36 are symmetrical, and such symmetrical plasma density profiles can be obtained in substantially the same manner in every rotation direction of the antenna because three antenna elements are twisted with one another at an angle of 120°.

In the plasma generators shown in FIGS. 1 through 8, a single parallel antenna 30 is installed outside the upper portion of the chamber 10. In consideration of a fact that a plasma density is lower at the central portion of the chamber 10 than at the peripheral portion of the chamber 10, a parallel antenna 40 having the same structure as the parallel antenna 30 installed at the peripheral portion of the chamber 10 may be installed inside an upper portion of the chamber 10 in a concentric shape, and an equivalent circuit thereof is shown in FIG. 9.

Figure 9:
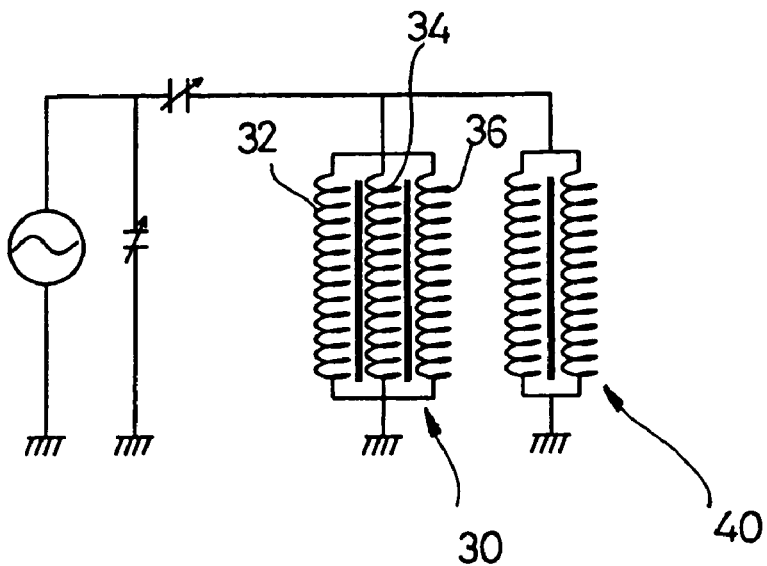
FIG. 9 is an equivalent circuit diagram of the plasma generator according to another embodiment of the present invention, in which parallel antennas are installed inside and outside the plasma generator.

According to the embodiment shown in FIG. 9, since there are provided the outer parallel antenna 30 and the inner parallel antenna 40, rotation symmetry of a plasma density profile can be obtained throughout the chamber and plasma densities can be maintained at a uniform level at the peripheral and central portions of the chamber. Also, the plasma generator may further include means for adjusting current amounts applied to the outer parallel antenna 30 and the inner parallel antenna 40. Further, for adjusting antenna impedance, the number of crossings of the inner parallel antenna is made different from the number of crossings of the outer parallel antenna. For example, the outer parallel antenna may be configured such that three antenna elements are twisted in a triple-helical manner, and the inner parallel antenna may be configured such that three antenna elements are twisted in a double-helical manner.

To overcome problems of the conventional inductively coupled plasma generator capable of generating plasma in a relatively high density, including a difficulty of obtaining high selectivity due to a large volume of a chamber and a high electron temperature, the plasma generator according to the present invention can obtain high selectivity by employing a parallel antenna which allows a high frequency discharge and has low impedance to obtain a low electron temperature and a minimized volume of a chamber, and by twisting the parallel antenna so as to establish rotation symmetry of a plasma density profile within the chamber.

In the plasma generator according to the present invention, to shorten a retention time of plasma within a chamber, it is necessary to minimize a volume of the chamber. Unlike in the conventional inductively coupled plasma generator based on a dispersion method for adjusting plasma uniformity, a volume of a chamber unavoidably becomes relatively bulky, according to the present invention, since rotation symmetry of a plasma density profile can be obtained by the parallel antenna, a predetermined level of low aspect ratio can be realized required without employing a dispersion method. Also, plasma densities can be uniformly maintained at the peripheral and central portions of a chamber where a target material to be process is placed by installing an outer parallel antenna and an inner parallel antenna. Thus, even if the target material is placed at a higher position, the volume of the chamber can be minimized because the distance between the top and bottom of the chamber can be reduced. Since antenna elements are parallel connected to each other, low impedance and a high frequency discharge are allowed, thereby reducing an electron temperature, thereby obtaining high selectivity, which is required for etching an oxide film of a semiconductor.

Figure 10:
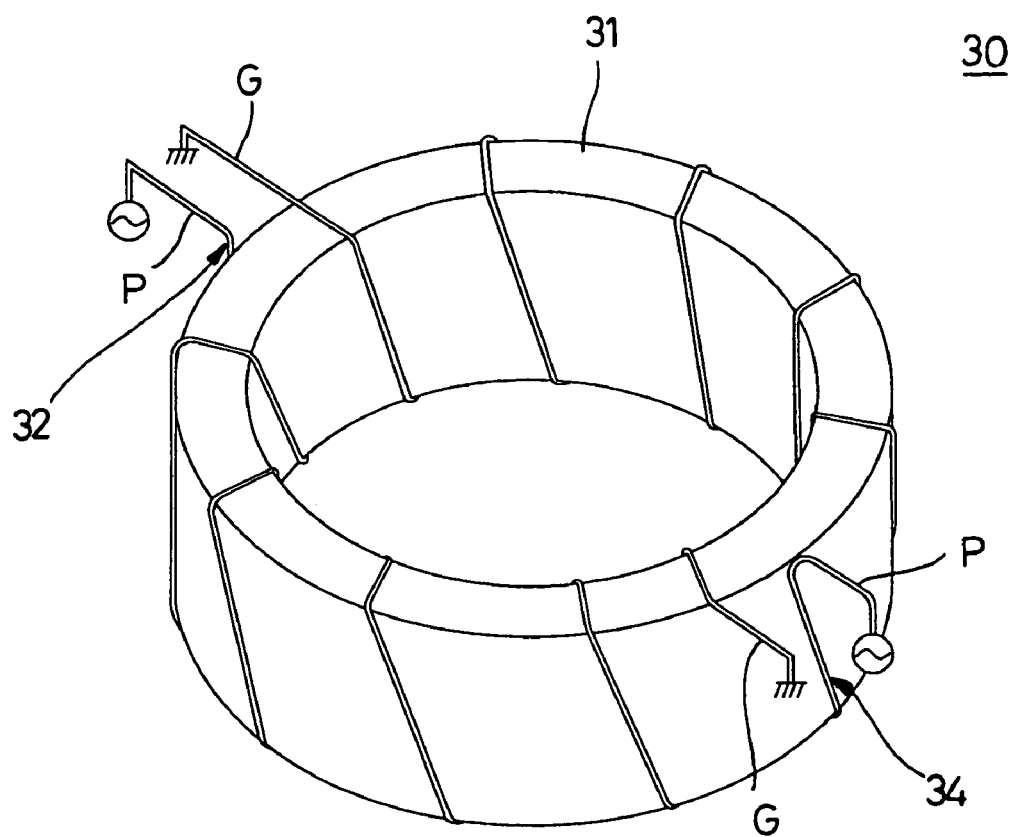
FIG. 10 illustrates the structure of an antenna of the plasma generator according to still another embodiment of the present invention.
Figure 11:
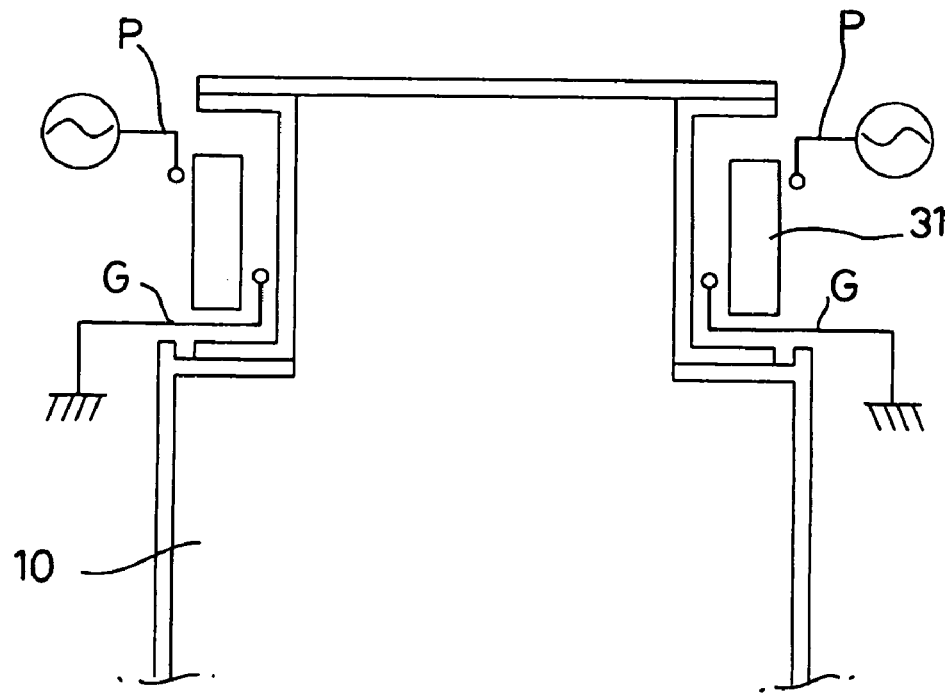
FIG. 11 is a cross-sectional view illustrating an installation state of the antenna shown in FIG. 10.

FIG. 10 illustrates the structure of an antenna of the plasma generator according to still another embodiment of the present invention, and FIG. 11 is a cross-sectional view illustrating an installation state of the antenna shown in FIG. 10.

The antenna shown in FIG. 10 is constructed such that two antenna elements 32 and 34 are wound around a short, tubular bovine 31. The two antenna elements 32 and 34 which are connected in parallel are disposed such that a powered end P of each of the antenna elements 32 and 34 is symmetric to a ground end G of each of the antenna elements 32 and 34 in view of the center C of the bovine 31. The respective antenna elements 32 and 34 are twisted with respect to each other in a double-helical manner. The antenna elements 32 and 34 are configured such that the powered end P of each of the antenna elements 32 and 34 is positioned at an outer portion of the bovine 31 and the ground end G of each of the antenna elements 32 and 34 is positioned at an inner portion of the bovine 31, and a high voltage is applied to the powered end P, thereby minimizing a drop in the plasma density due to ion loss occurring at the power end P. A drop in the plasma density due to ion loss at the powered end P of one antenna element 32, and a drop in the plasma density due to a non-inductive electric field at a disconnected portion of the powered end P and the ground end G of the one antenna element 32 are compensated for because the central portions 34*a* and 36*a* of the other antenna elements 34 and 36 having the same radium and twisted with each other in a double-helical manner, that is, a portion at which plasma density is relatively higher than at the powered end P, overlap at the same location, thereby ensuring rotation symmetry of a plasma density profile.

Figure 2:
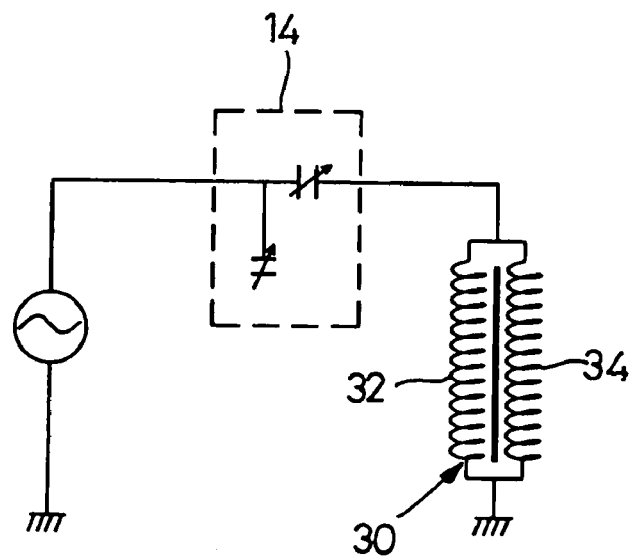
FIG. 2 is an equivalent circuit diagram of the plasma generator according to an embodiment of the present invention.

The antenna 30 shown in FIG. 10 is simply modified so that it can perform the same functions as the antennas shown in FIGS. 2 and 3 to be used in a cylindrical inductively coupled plasma generator shown in FIG. 11, and explanation of the functions will not be given.

Figure 12:
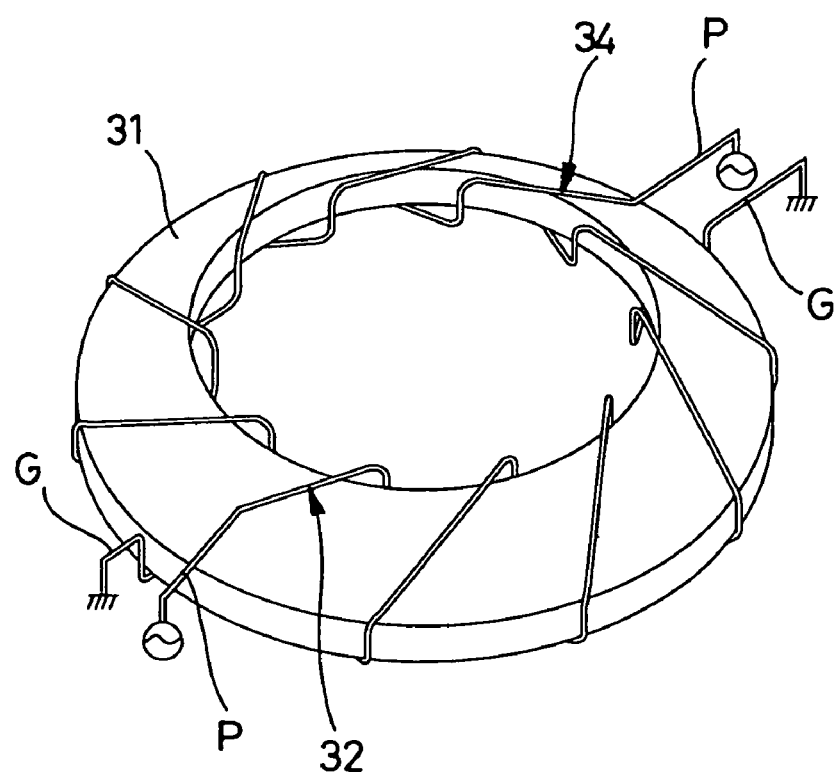
FIG. 12 illustrates the structure of an antenna of the plasma generator according to still another embodiment of the present invention.
Figure 13:
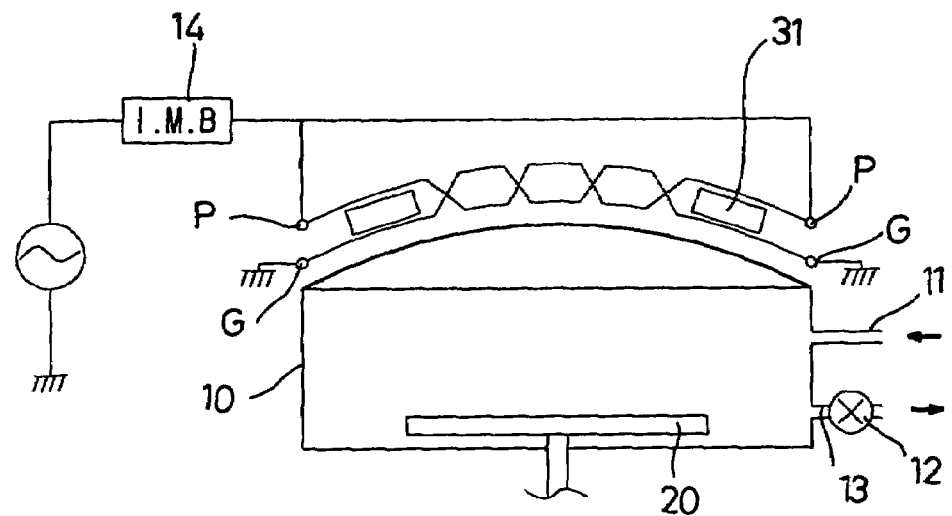
FIG. 13 is a cross-sectional view illustrating an installation state of the antenna shown in FIG. 12.

FIG. 12 illustrates the structure of an antenna of the plasma generator according to still another embodiment of the present invention, and FIG. 13 is a cross-sectional view illustrating an installation state of the antenna shown in FIG. 12. The antenna according to this embodiment is configured such that antenna elements 32 and 34 are wound around a conical bovine 31 to be suitably installed on a dome-shaped, inductively coupled plasma generator, and functions and effects thereof are the same as those in the first embodiment of the present invention.

Figure 14:
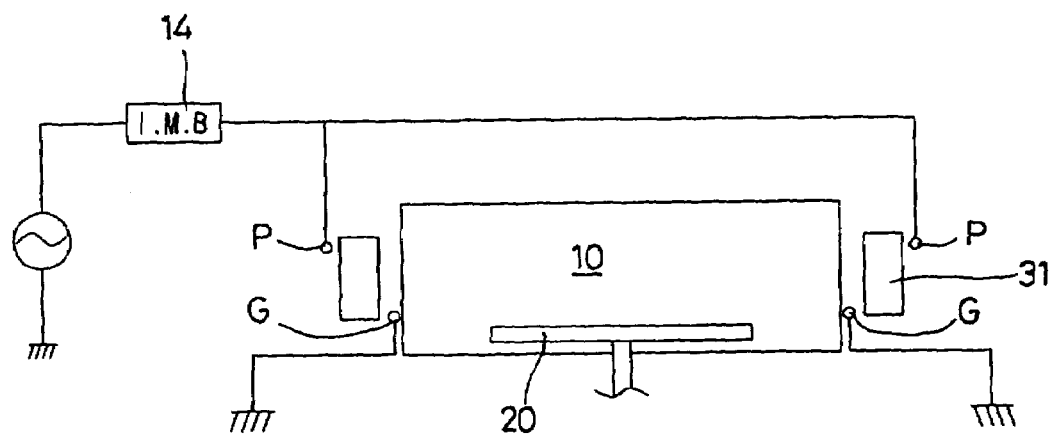
FIG. 14 is a cross-sectional view of a plasma generator according to still another embodiment of the present invention.

FIG. 14 is a cross-sectional view of a plasma generator according to still another embodiment of the present invention, in which the antenna 30 shown in FIG. 10 is employed in the plasma generator having an antenna 30 installed at a lateral portion of the chamber 10. Functions thereof are the same as those in FIGS. 10 and 11 and a detailed explanation will not be given.

Although the antennas shown in FIGS. 10 through 14 have two antenna elements, which are connected to each other in parallel, the antenna structure of the present invention is not limited thereto, and 3 or more antenna elements can be symmetrically disposed to establish rotation symmetry of a plasma density profile.

INDUSTRIAL APPLICABILITY

As described above, according to the present invention, the antenna structure of the inductively coupled plasma generator is improved, so that it can reduce an electron temperature to be suitable for etching an oxide film, ensure high selectivity by reducing a volume of a chamber, and can accurately fabricate a large-diameter wafer by establishing rotation symmetry of a plasma density profile.

What is claimed is:

1. An inductively coupled plasma generator having a low aspect ratio reaction gas, comprising:
    a chamber having a gas inlet through which a reaction gas is supplied, a vacuum pump for maintaining the inside of the chamber vacuum and a gas outlet for exhausting the reaction gas after completion of the reaction;
    a chuck for mounting a target material to be processed inside the chamber; and
    an antenna to which high-frequency power is applied, the antenna provided at upper and lateral portions of the chamber, wherein the antenna has parallel antenna elements in which a discharge of a high frequency is allowed and impedance is low to ensure a low electron temperature, the antenna is disposed such that a powered end of each of the antenna elements and a ground end of each of the antenna elements opposite to the powered end are symmetrical in view of a center of an imaginary circle formed by the antenna to establish rotation symmetry of plasma density profiles, the antenna elements are twisted in a helical manner, and the powered end of each of the antenna elements is positioned to be far from the chamber and the ground end of each of the antenna elements is positioned to be close to the chamber, thereby compensating for a drop in the plasma density due to ion loss occurring at the powered end.

2. The inductively coupled plasma generator of claim 1, wherein the parallel antenna has at least three antenna elements symmetrically cross with one another and twisted in a helical manner.

3. The inductively coupled plasma generator of claim 1, further comprising another parallel antenna connected to the parallel antenna in parallel, twisted in a helical manner like the parallel antenna, and installed inside an upper portion of the chamber.

4. The inductively coupled plasma generator of claim 1, wherein the antenna elements are wound on a bovine to maintain the twisted shape.

* * * * *